US010612980B2

(12) United States Patent
Jurski et al.

(10) Patent No.: US 10,612,980 B2
(45) Date of Patent: Apr. 7, 2020

(54) TEMPERATURE SENSING BASED FLOW MONITORING AND FAULT DETECTION

(71) Applicant: Intel Corporation, Santa Clara, CA (US)

(72) Inventors: Janusz P. Jurski, Hillsboro, OR (US); Tozer J. Bandorawalla, Portland, OR (US); Ramkumar Nagappan, Chandler, AZ (US); Mariusz Oriol, Gdynia (PL); Piotr Sawicki, Gdansk (PL); Robin A. Steinbrecher, Olympia, WA (US); Shankar Krishnan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 185 days.

(21) Appl. No.: 15/629,625

(22) Filed: Jun. 21, 2017

(65) Prior Publication Data

US 2018/0372551 A1    Dec. 27, 2018

(51) Int. Cl.
| | |
|---|---|
| *G01K 3/08* | (2006.01) |
| *F24F 11/30* | (2018.01) |
| *H05K 7/20* | (2006.01) |
| *G01K 1/02* | (2006.01) |
| *F24F 11/32* | (2018.01) |
| *F24F 110/00* | (2018.01) |

(52) U.S. Cl.
CPC ............... *G01K 3/08* (2013.01); *F24F 11/30* (2018.01); *G01K 1/026* (2013.01); *H05K 7/20745* (2013.01); *H05K 7/20836* (2013.01); *F24F 11/32* (2018.01); *F24F 2110/00* (2018.01)

(58) Field of Classification Search
CPC ..... G01K 3/08; G01K 2003/145; F24F 11/30; F24F 11/32; F24F 2110/00; F24F 2110/10; F24F 11/38
See application file for complete search history.

(56) References Cited

U.S. PATENT DOCUMENTS

| | | | | |
|---|---|---|---|---|
| 5,467,607 | A * | 11/1995 | Harvey | G05D 23/1932 62/186 |
| 5,790,430 | A * | 8/1998 | Steiert | H05K 7/20209 340/648 |
| 6,305,180 | B1 * | 10/2001 | Miller | H05K 7/20572 165/104.33 |
| 6,950,773 | B1 * | 9/2005 | Gross | G01K 7/42 374/E7.042 |
| 7,031,154 | B2 * | 4/2006 | Bash | H05K 7/20718 165/80.3 |
| 8,449,173 | B1 * | 5/2013 | Strong | G01M 99/002 324/500 |

(Continued)

*Primary Examiner* — Lisa M Caputo
*Assistant Examiner* — Philip L Cotey
(74) *Attorney, Agent, or Firm* — Green, Howard, & Mughal LLP (57) ABSTRACT

An apparatus is provided which comprises: a first circuitry to receive a measurement of a first temperature of a section of a computing device during a first loading condition of the computing device, and to receive a measurement of a second temperature of the section of the computing device during a second loading condition of the computing device; and a second circuitry to detect a potential fault in a cooling system to cool the computing device, based at least in part on the first temperature and the second temperature.

18 Claims, 5 Drawing Sheets

(56) References Cited

U.S. PATENT DOCUMENTS

| | | | | |
|---|---|---|---|---|
| 2005/0075065 A1* | 4/2005 | Nair | F24F 11/0001 | 454/186 |
| 2005/0267639 A1* | 12/2005 | Sharma | G05D 23/1931 | 700/276 |
| 2007/0125107 A1* | 6/2007 | Beam | | 62/186 |
| 2008/0300818 A1* | 12/2008 | Brey | H05K 7/20745 | 702/130 |
| 2010/0263855 A1* | 10/2010 | Arimilli | G05D 23/1931 | 165/288 |
| 2010/0312415 A1* | 12/2010 | Loucks | G06F 1/206 | 700/300 |
| 2010/0315223 A1* | 12/2010 | Gross | G05B 13/048 | 340/500 |
| 2011/0060470 A1* | 3/2011 | Campbell | G05D 23/1934 | 700/282 |
| 2011/0060571 A1* | 3/2011 | Ueda | G06F 17/5004 | 703/9 |
| 2011/0146339 A1* | 6/2011 | Yamashita | F24F 3/06 | 62/513 |
| 2012/0017630 A1* | 1/2012 | Okabe | F24F 6/12 | 62/407 |
| 2012/0224976 A1* | 9/2012 | Nagamatsu | G06F 1/206 | 417/1 |
| 2013/0128918 A1* | 5/2013 | Campbell | H05K 7/20836 | 374/57 |
| 2014/0202678 A1* | 7/2014 | Goth | H05K 7/20772 | 165/287 |
| 2014/0297038 A1* | 10/2014 | Nishioka | G06F 1/206 | 700/275 |
| 2015/0005949 A1* | 1/2015 | Haridass | G06F 1/206 | 700/275 |
| 2015/0075764 A1* | 3/2015 | Goth | H05K 7/20772 | 165/279 |
| 2015/0134123 A1* | 5/2015 | Obinelo | G05B 15/02 | 700/277 |
| 2015/0211774 A1* | 7/2015 | Tamaki | F25B 49/00 | 62/126 |
| 2016/0183408 A1* | 6/2016 | Sutherland | F25D 17/02 | 62/93 |
| 2016/0295750 A1* | 10/2016 | Zhang | H05K 7/20836 | |
| 2017/0205098 A1* | 7/2017 | Wacker | G05B 15/02 | |
| 2017/0205099 A1* | 7/2017 | Sanghamitra | H04L 67/10 | |
| 2018/0209673 A1* | 7/2018 | Yang | F24F 5/0046 | |

\* cited by examiner

TEMPERATURE SENSING BASED FLOW MONITORING AND FAULT DETECTION

BACKGROUND

As power and density of computational nodes increase in computer data centers and supercomputers, liquid cooling becomes necessary in many scenarios. A typical datacenter or a supercomputer may have a large number of and complex cooling loops circulating coolant for cooling the computational nodes. Cooling flow paths in such cooling loops may get at least partial blockage over time, e.g., due to corrosion, bio growth, debris, etc. Such blockage may decrease cooling capacity of such cooling flow paths.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

In some embodiments, a system (e.g., a datacenter, a supercomputer, etc.) may have a large number of computing devices. Liquid cooling may be employed to cool such a system. For example, a large number of and complex cooling loops may circulate coolant for cooling the computing devices. Cooling flow paths in such cooling loops may get at least partial blockage over time, e.g., due to corrosion, bio growth, debris, etc.

In some embodiments, to detect malfunction (e.g., blockage, loss of pressure, leakage, etc.) in the cooling flow paths, temperature of individual computing devices may be monitored during a first instance, e.g., when the computing devices operate based on a pre-specified load. Such monitoring during the first instance may be performed, for example, while booting the computing devices, during a start-up of a cooling arrangement, after major maintenance of the cooling arrangement, when one or more computing devices are replaced with replacement computing devices, etc. Furthermore, during the first instance, temperature of inlet coolant may also be monitored.

In some embodiments, temperature of individual computing devices may also be monitored during a second instance, e.g., after a few weeks, few months, or even a few years after the monitoring associated with the first instance. In some embodiments, the computing devices may be loaded during the monitoring of the second instance, e.g., substantially similar to the loading of the computing devices during the monitoring of the first instance. During the second instance, temperature of inlet coolant may also be monitored.

In some embodiments, the temperature of the computing devices and the inlet coolant monitored during the first instance may be compared to the temperature of the computing devices and the inlet coolant monitored during the second instance. Potential anomalies in the cooling arrangement (e.g., potential blockage in cooling flow paths) may be detected based on such comparison.

In some embodiments, the teachings of this disclosure may be employed to provide early warning about potential issues (e.g., partial blockage, leakage, pressure drop, etc.) associated with coolant flow paths, heat exchangers, etc. Convention systems may monitor flow paths using flow sensors, pressure sensors, temperature sensors, etc. However, such sensors may be expensive and difficult to install in all flow paths. For example, super computers and data centers may have thousands of computing nodes, and large and complex manifold of flow paths for cooling, and installing sensors in such complex manifold may be difficult, may take large space, and may be cost inefficient. In contrast, the system discussed herein may utilize temperature sensors that may already be embedded in the computing devices for purposes of monitoring temperature of these computing devices. The system may, for example, monitor individual computing devices and may detect potential fault with a coolant flow path of a single computing device among thousands of computing devices, based on such monitoring. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over." "under." and the like in the description and in the claims, if any, are used for descriptive purposes and not necessarily for describing permanent relative positions.

Figure 1:
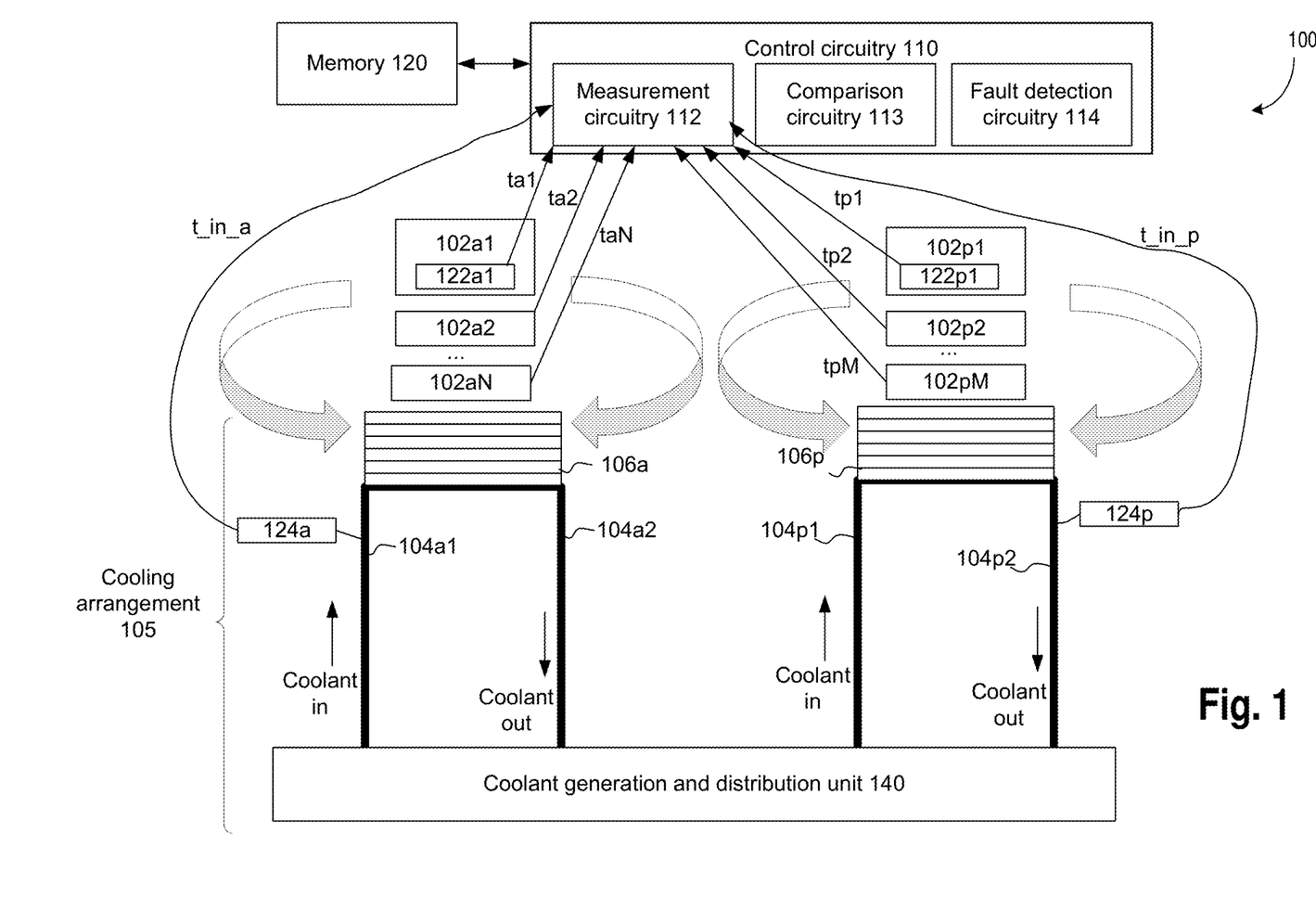
FIG. 1 schematically illustrates a system comprising a control circuitry to measure temperature of a plurality of computing devices, and to detect potential faults in a cooling arrangement for cooling the plurality of computing devices, according to some embodiments.

FIG. 1 schematically illustrates a system 100 comprising a control circuitry 110 to measure temperature of a plurality of computing devices 102, and to detect potential faults in a cooling arrangement 105 for cooling the plurality of computing devices 102, according to some embodiments. The plurality of computing devices comprises computing devices 102a1, 102a2, 102aN, 102p1, 102p2, 102pM, where N and M may be appropriate integers. The computing devices 102a1, 102a2, 102aN may be generally referred to as a computing device 102a in singular, and computing devices 102a in plural. The computing devices 102p1, 102p2, 102pM may be generally referred to as a computing device 102p in singular, and computing devices 102p in plural. The computing devices 102a and 102p may be generally referred to as a computing device 102 in singular, and computing devices 102 in plural. Although a specific number and arrangement of the computing devices 102 are illustrated in FIG. 1, such a number and arrangement of the computing devices 102 are merely an example, and does not limit the scope of this disclosure.

In some embodiments, a computing device 102 may be any appropriate type of computing device, e.g., a processor, a server, a blade server, a rack mounted server, a system-on-a-chip (SOC), a memory, a semiconductor chip or die, a memory chip, a combination of one or more of these components, and/or any appropriate computing device. For example, a computing device 102 may be a stripped-down server computer with a modular design optimized to minimize the use of physical space and energy. The teachings of this disclosure are not limited by the type, the number, and/or the arrangement of the computing devices 102.

In an example, one or more of the computing devices 102 may be mounted on a server rack, a blade enclosure, and/or the like. In some embodiments, the computing devices 102 may be within a data center that may employ a large number of such computing devices 102 (e.g., thousands of computing devices 102). The computing devices 102a may be arranged in a cluster (e.g., arranged within a server rack or a blade enclosure), and the computing devices 102p may be arranged in another cluster (e.g., arranged within another server rack or another blade enclosure).

In operation, the computing devices 102 may generate heat. Performance of the computing devices 102 may be degraded if, for example, the heat is not efficiently removed. In some embodiments, a cooling arrangement 105 (henceforth also referred to as an "arrangement 105") may be configured to remove heat from the computing devices 102.

In some embodiments, the arrangement 105 may, for example, circulate coolant through the cabinets and to cold plates over individual computing devices 102 and/or electronics that may have to be cooled. The coolant circulated over or near the computing devices 102 may be any appropriate coolant used for purposes of cooling, such as water or another appropriate liquid coolant.

In some embodiments, a coolant generation and distribution unit 140 (henceforth also referred to herein as "unit 140") may supply coolant for cooling the computing devices 102. The unit 140 may comprise any appropriate arrangements for delivering coolant at an appropriate temperature (e.g., sufficiently low temperature). Such arrangements may include, merely as an example, heat exchangers, cooling towers, condenser water system, chilled water system, chillers, pumps, cooling distribution unit, facility water system, etc. Any appropriate type of coolant generation and distribution unit 140 may be used.

In some embodiments, relatively low temperature coolant may be delivered to the computing devices 102a via an inlet 104a1. Once the coolant cools the computing devices 102a, the relatively moderate or high temperature coolant may exit via outlet 104a2.

The heat exchange between the incoming coolant in the inlet 104a1 and the computing devices 102a may be accomplished by components 106a. In some embodiments, the components 106a may comprise coolant flow paths for circulating the coolant on or near the components 102a, heat exchangers, pumps, etc. In some embodiments, a coolant flow path may comprise a corresponding one or more heat exchangers or cold plates, which may transfer the heat from the computing devices 102a to the coolant.

In an example, for one or more of the components 102a, there may be a flow path that may circulate coolant on or near a periphery of the components 102a. Merely as an example, the coolant may be circulated in series, in parallel, and/or a combination thereof near the components 102a. For example, a first flow path of the component 106a may bring coolant on or near computing devices 102a1 and 102a2, a second flow path of the component 106a may bring coolant on or near computing device 102a3, and so on. Such layout of the components 106a within the components 102a are symbolically represented by the two arrows in FIG. 1. Thus, the components 106a are merely schematically illustrated in FIG. 1, and does not represent actual locations, shapes or sizes of these components.

In some embodiments, relatively low temperature coolant may be provided to components 106p via an inlet 104p1, where the coolant in the components 106p may cool the computing devices 102p. The relatively moderate or high temperature coolant may exit via the outlet 104p2.

In some embodiments, over time, one or more flow paths in the components 106a, 106p (or the flow path of the inlets 104a1, 104p1, or outlets 104a2, 104p2) may malfunction. For example, a flow path may become clogged, or at least partially clogged, due to rust, corrosion, bio growth, debris in the coolant, etc. In another example, a flow path may leak or may have relatively low pressure (e.g., due to malfunctioning of a pump for circulating the coolant). In some embodiments, due to malfunctioning of a flow path, computing devices that are depended for cooling on that flow path may experience a rise in temperature, which may damage the computing devices. For example, the malfunction (e.g., a blockage) may be gradual, and may not be readily noticeable, but such a gradual blockage of the flow path may expose computing devices 102 to high temperature (e.g., higher than if there was no malfunctioning in the flow path) over a long period of time.

In conventional systems, some of the flow paths may have flow sensors, pressure sensors, temperature sensors, etc. embedded thereon, which may monitor flow of coolant of the flow paths. However, due to a cost associated with embedding such sensors on a large number of flow paths that are present in a typical data center, it may not be economically feasible to monitor all, most or even at least a few flow paths using such sensors. The teachings of this disclosure may be used to proactively detect any potential malfunction in the arrangement 105 (e.g., potential blockage, leakage, loss of pressure, etc. in a flow path), without using such expensive sensors in the flow paths.

In some embodiments, the system 100 may comprise a plurality of temperature sensors 122. The temperature sensors 122 may be generally referred to as a "sensor 122" in singular, and "sensors 122" in plural. For example, the computing device 102a1 may comprise a sensor 122a1, the computing device 102a2 may comprise a sensor 122a2, the computing device 102aN may comprise a sensor 122aN, the computing device 102p1 may comprise a sensor 122p1, the computing device 102pM may comprise a sensor 122pM, and so on. For purposes of illustrative clarity, only the sensors 122a1 and 122p1 in the computing devices 102a1 and 102p1 are illustrated in FIG. 1. In some embodiments, each of the computing devices 102 may comprise a corresponding sensor; and in some other embodiments, not all of the computing devices 102 may comprise a corresponding sensor. In some embodiments, a computing device 102 may comprise more than one temperature sensor 122. In some embodiments, the sensors 122 may be digital thermal sensors.

In some embodiments, a sensor 122 may measure a temperature of at least a section of a corresponding computing device 102. Merely as an example, a sensor 122 may be a die temperature sensor to measure a temperature of a section of a die of the computing device 102. In some embodiments, a sensor 122 may be embedded within the corresponding computing device 102. In some other embodiments, at least some of the sensors 122 may be located external to the corresponding computing devices.

In some embodiments, the sensors 122 may periodically or intermittently measure the temperature of the corresponding computing devices 102. In some embodiments, the sensors 122 may continuously or near continuously measure the temperature of the corresponding computing devices 102. In some embodiments, the sensors 122 may measure the temperature of the corresponding computing devices 102, for example, at least during start-up of the computing devices, and/or whenever required.

In some embodiments, the system 100 may comprise a control circuitry 110 (henceforth referred to as "circuitry 110"). The circuitry 110 may comprise a measurement circuitry 112. The measurement circuitry 112 may receive temperature measurements from the sensors 122. For example, the sensor 122a1 may output temperature ta1 to the measurement circuitry 112, based on measuring the temperature of the computing device 102a1; the sensor 122a2 may output temperature ta2 to the measurement circuitry 112, based on measuring the temperature of the computing device 102a2; the sensor 122p1 may output temperature tp1 to the measurement circuitry 112, based on measuring the temperature of the computing device 102p1, and so on, as illustrated in FIG. 1.

In some embodiments, the system 100 may further comprise temperature sensors 124a and 124p to measure temperatures t_in_a and t_in_p, respectively, of the coolant in the inlets 104a1 and 104p1, respectively, and transmit such measurements to the measurement circuitry 112.

In some embodiments, the circuitry 110 may be coupled to a memory 120. The memory 120 may include, for example, nonvolatile (state does not change if power to the memory device is interrupted) and/or volatile (state is indeterminate if power to the memory device is interrupted) memory devices. In some embodiments, the measurement circuitry 112 may receive temperature measurements ta1, . . . , taN, tp1, . . . , tpM, t_in_a, and t_in_p from the corresponding temperature sensors, and store the temperature measurements in the memory 120.

In some embodiments, the circuitry 110 may further comprise a comparison circuitry 113 and a fault detection circuitry 114, each of which is discussed in detail herein later.

As discussed herein, relatively low temperature coolant may be supplied via the inlets 104a1 and 104p1. In some embodiments, inlet coolant may refer to the coolant supplied via the inlets 104a1, 104p1. In some embodiments, inlet coolant may refer to the coolant supplied to individual coolant flow paths in the components 106a and/or 106p. In some embodiments, a temperature of the inlet coolant may somewhat vary, e.g., based on a time of the day, month of the year, ambient temperature, working of the unit 140, etc. (e.g., may be higher in summer or during a sunny, warm day, and may be lower in winter or at night). The sensors 124a and/or 124p may measure the temperature of the inlet coolant.

Figure 2:
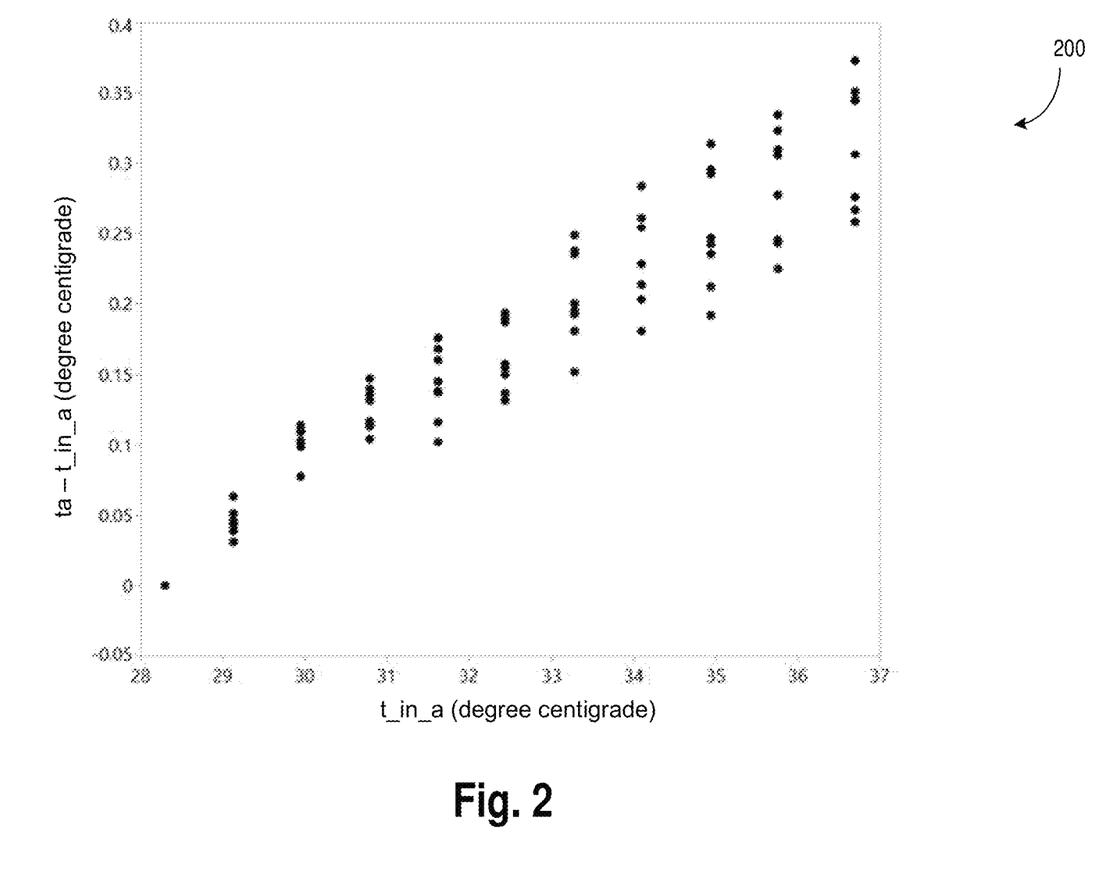
FIG. 2 illustrates a graph depicting an effect in temperature of a computing device due to a change in temperature of inlet coolant for cooling the computing device, according to some embodiments.

Let "ta" denote temperature of an example computing device 102a (e.g., if the computing device 102a1 is considered in the example, then the temperature ta is temperature ta1). FIG. 2 illustrates a graph 200 depicting an effect in a temperature of the computing devices 102 due to a change in the temperature of inlet coolant, according to some embodiments. In the graph 200, the X axis denotes the inlet coolant temperature t_in_a in degree centigrade. The Y axis denotes a difference between the temperature ta of the example computing device 102a and the inlet coolant temperature t_in_a (e.g., denotes (ta−t_in_a)), and is measured in degree centigrade. The graph 200 is generated experimentally.

As illustrated in FIG. 2, for a variation of up to 10 degree centigrade in the inlet coolant temperature t_in_a (e.g., a variation from about 28 to about 37 degree centigrade in the X axis), the corresponding change in (ta−t_in_a) in the Y axis is in the range of about 0.4 degree centigrade. Thus, the term (ta−t_in_a) may change insignificantly even for a significant change in the inter coolant (e.g., assuming that the computational workload of the computing device and other parameters do not change significantly). Accordingly, although the ambient temperature and/or the working of the unit 140 may affect and change the inlet coolant temperature, such a change in the inlet coolant temperature may not have any substantial effect on the difference between the temperature of individual computing devices 102 and the inlet coolant temperature. Put differently, the difference between the temperature of individual computing devices 102 and the inlet coolant temperature may change insignificantly (e.g., change by less than 0.5 degree centigrade), even if the inlet coolant temperature changes significantly (e.g., change by about 10 degree centigrade).

Figure 3:
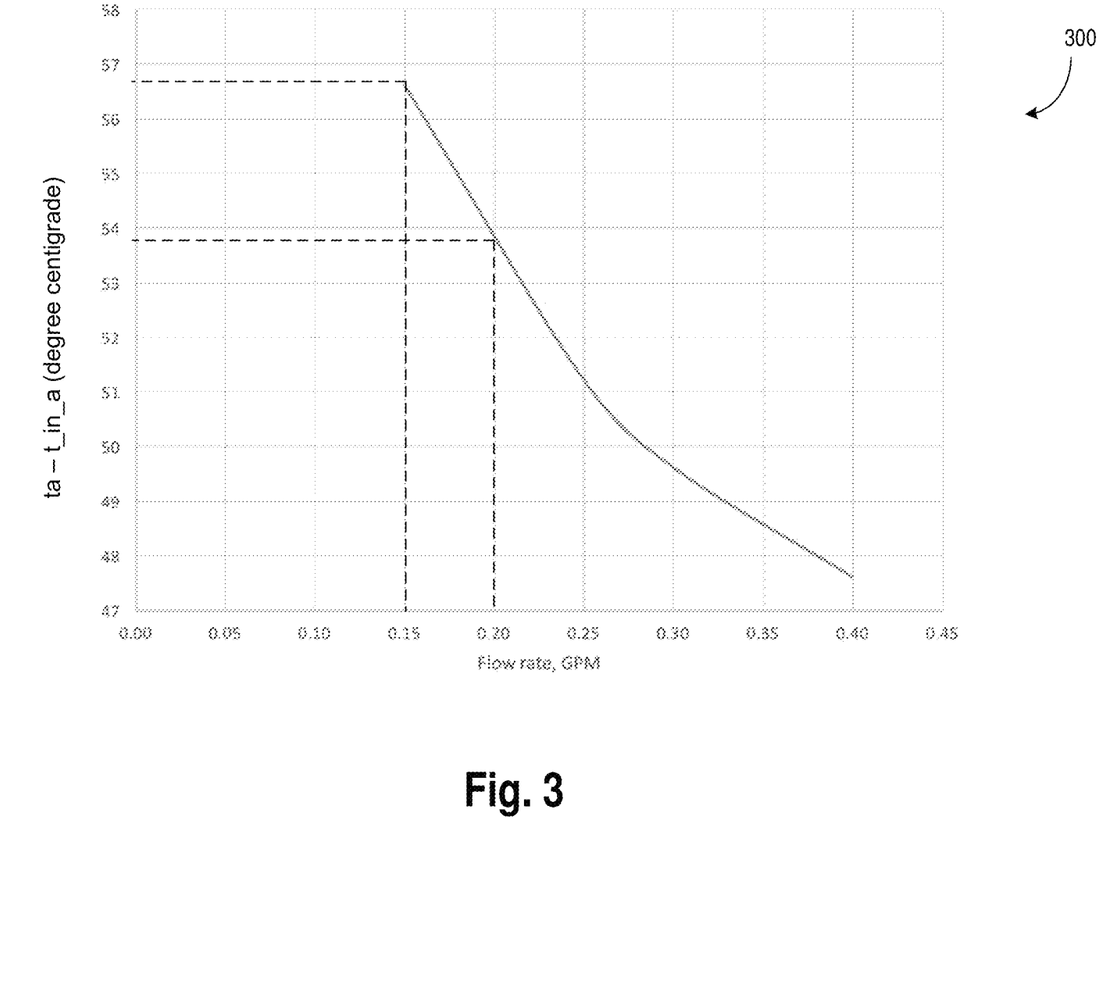
FIG. 3 illustrates a graph depicting (i) a difference between temperature of individual computing devices and inlet coolant temperature versus (ii) a flow of inlet coolant, according to some embodiments.

FIG. 3 illustrates a graph 300 depicting (i) a difference between the temperature of individual computing devices 102 and the inlet coolant temperature versus (ii) a flow of inlet coolant, according to some embodiments. The Y axis denotes a difference between temperature ta of an example computing device 102a and the inlet coolant temperature t_in_a (e.g., denotes (ta−t_in_a)), and is measured in degree centigrade. The X axis denotes a flow of coolant (e.g., for cooling the example computing device 102a) in gallon per minute (GPM).

In some embodiments, the X axis may be the flow rate of the coolant in the inlet 104a1. In some other embodiments, the X axis may denote the flow rate of coolant in a flow path that may be on or near the example computing device 102a (e.g., denote the flow rate of coolant in the flow path of one of the components 106a).

As illustrated in FIG. 3, a change in flow rate may significantly affect the difference between the temperature ta of the example computing device 102a and the inlet coolant temperature t_in_a (e.g., may significantly affect (ta−t_in_a)). For example, a reduction of the flow rate from 0.20 GPM to 0.15 GPM may increase the term (ta−t_in_a) from about 53.8 degree centigrade to about 56.8 degree centigrade. Put differently, for example, a reduction of coolant flow (e.g., due to a blockage or a partial blockage in a coolant flow path supplying coolant to cool the computing device 102a) may be reflected in the term (ta−t_in_a).

Figure 4:
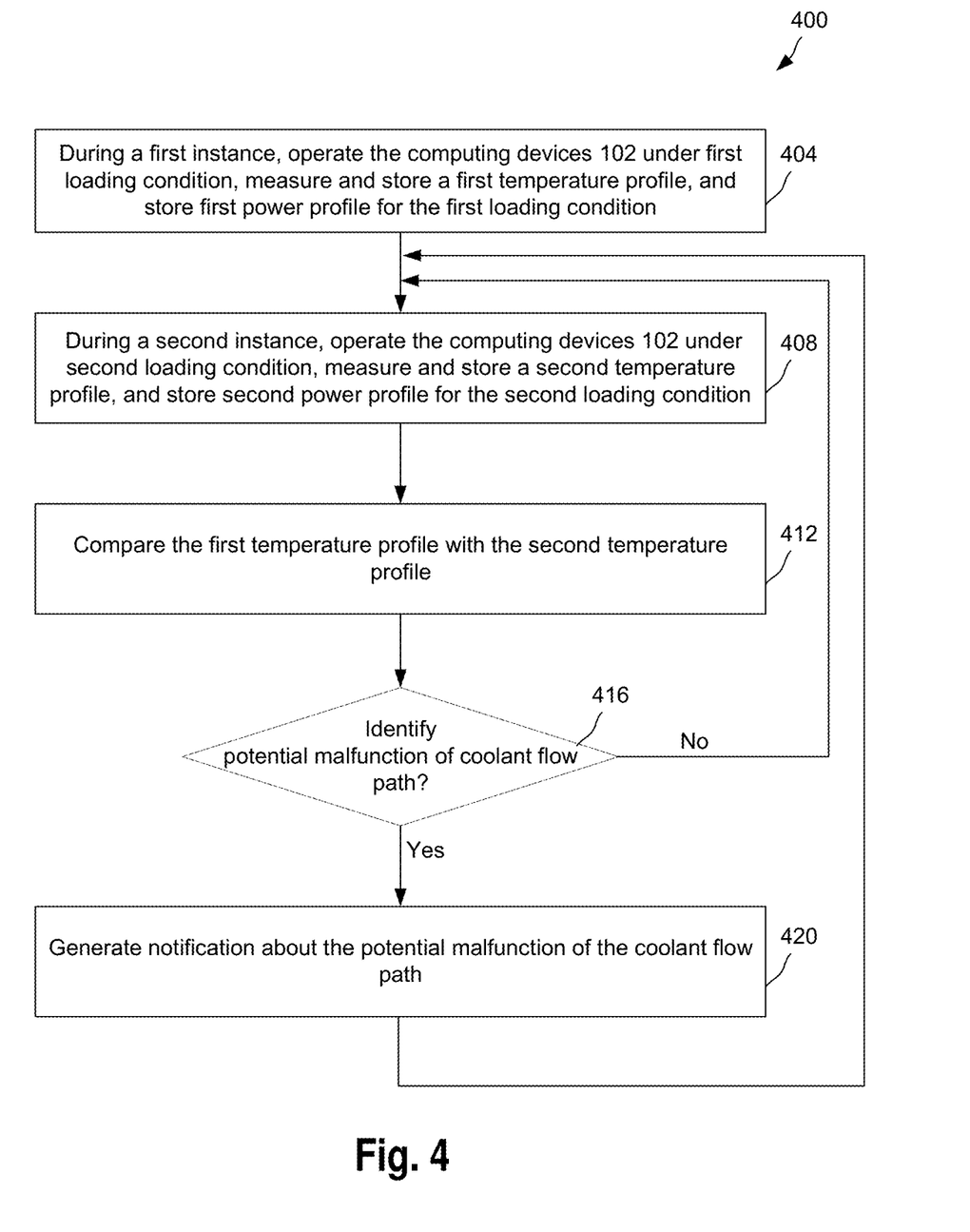
FIG. 4 illustrates a flow chart depicting an example method for detecting potential faults in a cooling arrangement for cooling a plurality of computing devices, e.g., by monitoring temperature profile of the plurality of computing devices and temperature profile of inlet coolant used for cooling, according to some embodiments.

FIG. 4 illustrates a flow chart depicting an example method 400 for detecting potential faults in a cooling arrangement (e.g., cooling arrangement 105) for cooling a plurality of computing devices (e.g., computing devices 102), e.g., by monitoring temperature profile of the plurality of computing devices and temperature profile of inlet coolant used for cooling, according to some embodiments. At 404, during a first instance, the computing devices 102 may be operated under a first loading condition. Also at 404, a first temperature profile may be measured and stored (e.g., stored by the measurement circuitry 112 in the memory 120).

In some embodiments, the first temperature profile may comprise temperatures ta1, ta2, . . . , taN, tp1, tp2, . . . , tpM from the computing devices 102a1, 102a2, 102aN, 102p1, 102p2, 102pM, respectively. In some embodiments, the first temperature profile may also comprise temperatures t_in_a and t_in_p, e.g., temperatures of inlet coolant. In some embodiments, the measurement circuitry 112 may store each of these temperatures at the first instance as the first temperature profile. In some embodiments, the measurement circuitry 112 may also store a difference between a temperature of a computing device and a temperature of a corresponding inlet coolant as the first temperature profile. For example, the measurement circuitry 112 may store (ta1−t_in_a), . . . , (taN−t_in_a), (tp1−t_in_p), . . . , (taM−t_in_p) as the first temperature profile.

In some embodiments, the first instance may be an instance when the system 100 is initialized and/or calibrated, e.g., when an initial characterization of the system 100 is being performed. For example, the block 404 may be performed during a boot-up of the computing devices 102, during a start-up of the cooling arrangement 105, after major maintenance of the cooling arrangement 105, when one or more computing devices 102 are replaced with replacement computing devices, and/or may be performed intermittently (e.g., after every few days, few weeks, or few months).

In some embodiments, the first loading condition may be generated by, for example, exposing individual computing devices 102 to a standard loading condition. For example, a dedicated benchmark program may be run in individual computing devices 102, that may expose the individual computing devices to a specified loading condition. Merely as an example, the individual computing devices 102 may operate a Power-Thermal Utility (PTU) program (e.g., a PTU program developed by Inter Corporation™), which may expose the computing devices 102 to pre-specified loading conditions. In some embodiments, when the computing devices 102 are running the dedicated program such as the PTU program, the temperature, energy and/or power consumption of individual computing devices 102 may be monitored, e.g., using the sensors 122 and/or appropriate power or energy counters (e.g., which may be incorporated in the computing devices 102, not illustrated in FIG. 1). In some embodiments, a power consumed by individual computing device 102 while running the PTU program may be limited to a predefined level, e.g., using some type of power limiting features. Merely as an example, Running Average Power Limiting (RAPL) and/or Intelligent Power Node Manager technologies offered by Intel Corporation® may be used for limiting the power consumption to the predefined level.

In some embodiments, at 404, a first power profile may also be stored. For example, the first power profile may correspond to the power consumption of individual computing devices 102 while being operated under the first loading condition. In some embodiments and as discussed above, all or at least some of the computing devices 102 may have about same power profile. In some embodiments, individual computing devices 102 may also have respective (and possibly different) power consumptions, which may be captured in the power profile.

In some embodiments, individual computing devices 102 may run the dedicated benchmark program such as the PTU for at least a threshold period of time, e.g., run for enough time such that the temperature of the computing devices 102 may stabilize. In an example, the threshold time may be about 1 minute. The first temperature profile at 404 of the method 400 may be measured at the end of the threshold time.

In some embodiments, the measurement of the first temperature profile at the first instance may be performed simultaneously for all the computing devices 102. In some other embodiments, the measurement of the first temperature profile at the first instance need not be performed simultaneously for all the computing devices 102. For example, assume that a heat generated by a first computing device (e.g., computing device 102a1) may affect a heat generated by a second computing device (e.g., computing device 102a2). For example, the computing devices 102a1 and 102a2 may be adjacently placed in a same server rack, cooled using the same coolant flow, etc. In such cases, the first temperature profile for the first and second computing devices 102a1 and 102a2 may be generated at the same or about same time. However, if the first computing device 102a1 is thermally independent of a third computing device 102p1, then the temperature measurements of these two computing devices may be done independently (e.g., at different times).

In some embodiments, even though all or at least some of the computing devices 102 may be loaded substantially similarly (e.g., such that these computing devices consume about the same power), individual computing devices 102 may exhibit a systemic variation in temperature. For example, the temperatures ta1, ta2, . . . , taN may not all be the same. Such variation in temperature may be due to the manifold design of the flow paths in the components 106a and/or 106p, random variation (e.g., due to unavoidable node to node manufacturing and assembly variation), and/or the like. For example, the flow of coolant through the computing devices 102 may be biased based on the relative position of the computing devices 102 in the coolant fluid network of a server rack or cabinet. An example of the random variation may be the device to device variation of thermal interface material thickness, e.g., due to manufacturing and assembly tolerances of mating parts.

In some embodiments and although not illustrated in FIG. 1, the first temperature profile may be compared to an expected temperature profile of the computing devices 102 (e.g., where the expected temperature profile may be based on the system flow design of the cooling arrangement 105). This comparison may explain the systemic variation of temperatures within the computing devices 102, and may be used to determine if the flow to individual computing devices 102 are as expected by design.

Referring again to the method 400, at 408, during a second instance, the computing devices 102 may be operated under second loading condition, a second temperature profile may be measured and stored (e.g., in the memory 120), and a second power profile for the second loading condition may also be measured and stored.

In an example, the second instance may be when a blockage in the coolant flow may be suspected. In another example, the second instance of measurement may be performed, for example, a few days, a few weeks, or a few months after performing the measurement associated with the first instance.

In some embodiments, similar to the first instance, during the second instance, the second temperature profile may comprise temperatures ta1, ta2, . . . , taN, tp1, tp2, . . . , tpM from the computing devices 102a1, 102a2, . . . , 102aN, 102p1, 102p2, . . . , 102pM, respectively. In some embodiments, the second temperature profile may also comprise temperatures t_in_a and t_in_p, e.g., temperatures of the inlet coolant. In some embodiments, the measurement circuitry 112 may store these temperatures at the second instance as the second temperature profile. In some embodiments, the measurement circuitry 112 may also store a difference between a temperature of a computing device and a temperature of a corresponding inlet coolant as the second temperature profile. For example, the measurement circuitry 112 may also store (ta1−t_in_a), . . . , (taN−t_in_a), (tp1−t_in_p), . . . , (taM−t_in_p) as the second temperature profile.

In some embodiments, the second loading condition may be generated by, for example, exposing individual computing devices 102 to a standard loading condition, e.g., using a dedicated benchmark program such as the PTU program (e.g., which may expose the computing devices 102 to pre-specified loading conditions). In some embodiments, when the computing devices 102 are running the dedicated program such as the PTU program, the temperature, energy and/or power consumption of individual computing devices 102 may be monitored, e.g., using the sensors 122 and/or appropriate power or energy counters. In some embodiments, the power consumed by individual computing device 102 while running the PTU program may be limited to a predefined level, e.g., using some type of power limiting features, such as the RAPL and/or the Intelligent Power Node Manager technologies. In some embodiments, the second power profile may correspond to the power consumption of individual computing devices 102 while being operated under the second loading condition.

In some embodiments, the second loading condition may be controlled such that the second loading condition may be about the same as the first loading condition. This may be achieved by appropriately configuring the PTU program. In an example, the first power profile may be about the same (e.g., substantially similar) as the second power profile. For example, during the first instance, assume that a computing device 102a1 consumes about Wa1 amount of power and a computing device 102a2 consumes about Wa2 amount of power, which may be stored in the first power profile. During the second instance, the second loading condition may be such that the computing device 102a1 also consumes about Wa1 amount of power and the computing device 102a2 consumes about Wa2 amount of power. Although the power consumption in the two instances for a specific computer device may not be exactly same, the power consumptions may be at least in the same range, or as close as possible (e.g., within a threshold range), e.g., such that similar amount of heat may be generated by respective computing devices during the two instances.

In some embodiments, individual computing devices 102 may run the dedicated program such as the PTU for at least a threshold period of time, e.g., run for enough time such that the temperature of the computing devices 102 may stabilize. In an example, the threshold time may be about 1 minute. The second temperature profile at 408 of the method 400 may be measured at the end of the threshold time.

In some embodiments, the measurement of the second temperature profile at the second instance may be performed simultaneously for all the computing devices 102. In some other embodiments, the measurement of the second temperature profile at the second instance need not be performed simultaneously for all the computing devices 102, e.g., as discussed with respect to measurement of the first temperature profile.

Referring again to the method 400, at 412, at 412, a comparison may be made (e.g., by the comparison circuitry 113) between the first temperature profile and the second temperature profile. For example, for a computing device 102a1, the first temperature profile may comprise a first temperature difference (e.g., ta1−t_in_a) measured during the first instance, and the second temperature profile may comprise a second temperature difference (e.g., ta1−t_in_a) measured during the second instance. At 412, the first temperature difference and the second temperature difference may be compared. Put differently, the temperature difference (ta1−t_in_a) for the computing device 102a1 measured during the first instance and the second instance, may be compared. Similarly, the temperature difference (tp1−t_in_p) for the computing device 102p1 measured during the first instance and the second instance may be compared. Similar comparison may be repeated for individual computing devices 102a and 102p.

At 416, based on the comparison result, it may be determined (e.g., by the fault detection circuitry 114) whether any potential malfunction of coolant flow path is identified. For example, for a specific computing device (e.g., computing device 102a1), the computing device 102a1 may be operated under about same loading condition in the first instance and the second instance (e.g., the first and second loading conditions may be about the same). Accordingly, assuming that the inlet coolant temperature and the coolant flow are same for both the first and second instances, the temperature rise of the computing device 102a1 should be about the same for both the first and second instances. Even if the coolant inlet temperature is different for the first and second instances, then assuming that the coolant flow are same for both the first and second instances, the temperature difference (ta1−t_in_a) should be about same for both the instances (e.g., as discussed with respect to FIG. 2, the inlet coolant temperature does not significantly affect the temperature difference). However, if there is at least a partial blockage in the flow path supplying coolant to cool the computing device 102a1 during the second instance, then the temperature difference (ta1−t_in_a) in the second instance may be higher than the temperature difference (ta1−t_in_a) in the first instance. Thus, the comparison at 413 may indicate if there is at least a partial blockage (or other type of malfunction, such as low coolant pressure, leakage in coolant flow path, or like) in the flow path supplying coolant to cool the computing device 102a1 during the second instance. Similar conclusion may be drawn for the coolant path supplying coolant to cool various other computing devices 102.

In some embodiments, a computing device (e.g., computing device 102a1) may have a thermal interface material (or be attached to such a thermal interface material), which may aid in heat exchange with the coolant. Over time, the thermal interface material may degrade at least in part, but may still be acceptable for use. In some embodiments, the comparison at 412 may account for such degradation of the thermal interface material, heat exchangers, regular degradation and wear and tear of the components 106a, 106p, etc. For example, if the measurements at the second instance is taken a significant time (e.g., a few years) after the measurements at the first instance, the temperature difference (ta1−t_in_a) in the second instance may be slightly higher than the temperature difference (ta1−t_in_a) in the first instance. Such slight rise in temperature at the second instance may be due to regular wear and tear, and degradation of thermal interface material, components 106, etc., and may not indicate at least a partial or at least a threshold amount of blockage in the coolant flow path. However, if the temperature difference (ta1−t_in_a) in the second instance is higher than the temperature difference (ta1−t_in_a) in the first instance by more than a threshold amount, then potential malfunction of a coolant flow path for the computing device 102a1 may be identified. In some embodiments, a change of, for example, about 3 degree centigrade in the temperature difference (ta1−t_in_a) in the second instance compared to that in the first instance may signify a reduction of about 20-30% in coolant flow (e.g., as illustrated in FIG. 3).

If "No" at 416, the method 400 may loop back to 408, where the measurements at the second instance may be repeated.

If "Yes" at 416, the method 400 may proceed to 420, where a notification may be generated about the potential malfunction of the coolant flow path. Such a notification may be transmitted to an administrator of the system 100, for example, so that maintenance of the flow path may be undertaken. Subsequently, the method 400 may loop back to 408, where the measurements at the second instance may be repeated.

In some embodiments, the measurements of the second instances may be repeated after some time and intermittently (e.g., after a few hours, few days, few weeks, few months, or a few years, or after a malfunction in coolant flow path is suspected). In some embodiments, the measurements of the second instances may be performed continuously.

The method 400 may provide early warning about potential issues (e.g., partial blockage, leakage, pressure drop, etc.) associated with coolant flow paths, heat exchangers, etc. Convention systems may monitor flow paths using flow sensors, pressure sensors, temperature sensors, etc. However, such sensors may be expensive and difficult to install in all flow paths. For example, super computers and data centers may have thousands of computing nodes, and large and complex manifold of flow paths for cooling, and installing sensors in such complex manifold may be difficult, may take large space, and may be cost inefficient. In contrast, the system 100 utilizes temperature sensors 122 and/or power/energy counters that may already be embedded in the computing devices 102 for purposes of monitoring of these computing devices. The method 400 may, for example, monitor individual computing devices and may detect potential fault with a coolant flow path of a single computing device among thousands of computing devices.

As discussed with respect to FIG. 4, during the second instance at 408, the second loading condition may be performed by loading a dedicated benchmark program, such as a PTU, which may expose the computing devices 102 to a pre-specified load. Other utilities may also be used to limit the loading during the second instance.

In some embodiments, instead of loading the computing devices 102 with such dedicated benchmark programs like PTU, the computing devices 102 may be exposed to actual workload that the computing devices 102 may perform on regular basis. For example, running the actual workload on the computing devices 102, while making measurements associated with the second instance, may allow continuous or near continuous monitoring of the temperature differences discussed herein above with respect to FIG. 4. This may, in turn, allow continuous or near continuous monitoring of potential malfunction in coolant flow paths.

In some embodiments, the first loading condition associated with the first instance of FIG. 4 may load a computing device 102 to a maximum allowable limit (e.g., using a dedicated benchmark program such as the PTU). Subsequently, whenever the computing device 102 operates at or near the maximum allowable limit, the measurements associated with the second instance may be undertaken, thereby allowing monitoring of the health of the cooling arrangement relatively frequently (e.g., without having to run the dedicated benchmark program such as the PTU for the measurements for the second instance).

Modern computing devices (e.g., such as processors) may normally provide various telemetry data, such as power or energy counters, that may monitor the activities of the processor and the computing device (e.g., may monitor an amount of power and/or energy consumed by the device, memory bandwidth utilization, and/or the like). Opportunistically, when similar workloads are run by multiple computing devices 102 (e.g., that may consume about similar amount of energy, about similar memory bandwidth, and/or that may have almost matching telemetry data), measurements associated with the first and/or second instance of FIG. 4 may be performed on these computing devices, e.g., to monitor the health of the cooling arrangement 105 (e.g., instead of, or in addition to running the dedicated benchmark program such as the PTU).

In many applications, (e.g., application involving High Performance Computing), multiple computing devices 102 may often run similar workload, and it may be likely that the energy consumed by the multiple computing devices 102 during runtime over a certain period is substantially the same (e.g., such similar workload may be reflected by similar or about similar telemetry data from these computing devices). Accordingly, during such instances, measurements associated with the first and/or second instance of FIG. 4 may be performed on these computing devices, e.g., to monitor the health of the cooling arrangement 105. Also, in some embodiments, in order to ensure that same or about same power consumption by individual computing devices, power limiting features may be used (e.g., RAPL utility, Intelligent Power Node Manager technologies, as discussed herein above). Taking measurements associated with the first and/or second instance while the computing devices 102 perform actual computational workload may be used to avoid running dedicated benchmark programs such as PTU on the computing devices (e.g., as these dedicated benchmark programs may run dummy programs to artificially load the computing devices, and may not perform actual and useful computational workload).

Various embodiments discussed herein relate to cooling computing devices 10 using a coolant (e.g., such as chilled water or other appropriate liquid coolant). However, the teachings of this disclosure may also be extended to detect potential fault in other types of cooling arrangement as well. For example, the teachings of this disclosure may also be extended to detect potential fault in an air cooling system as well, where one or more fans may cool one or more computing devices, as would be readily appreciated by those skilled in the art based on the teachings of this disclosure.

Figure 5:
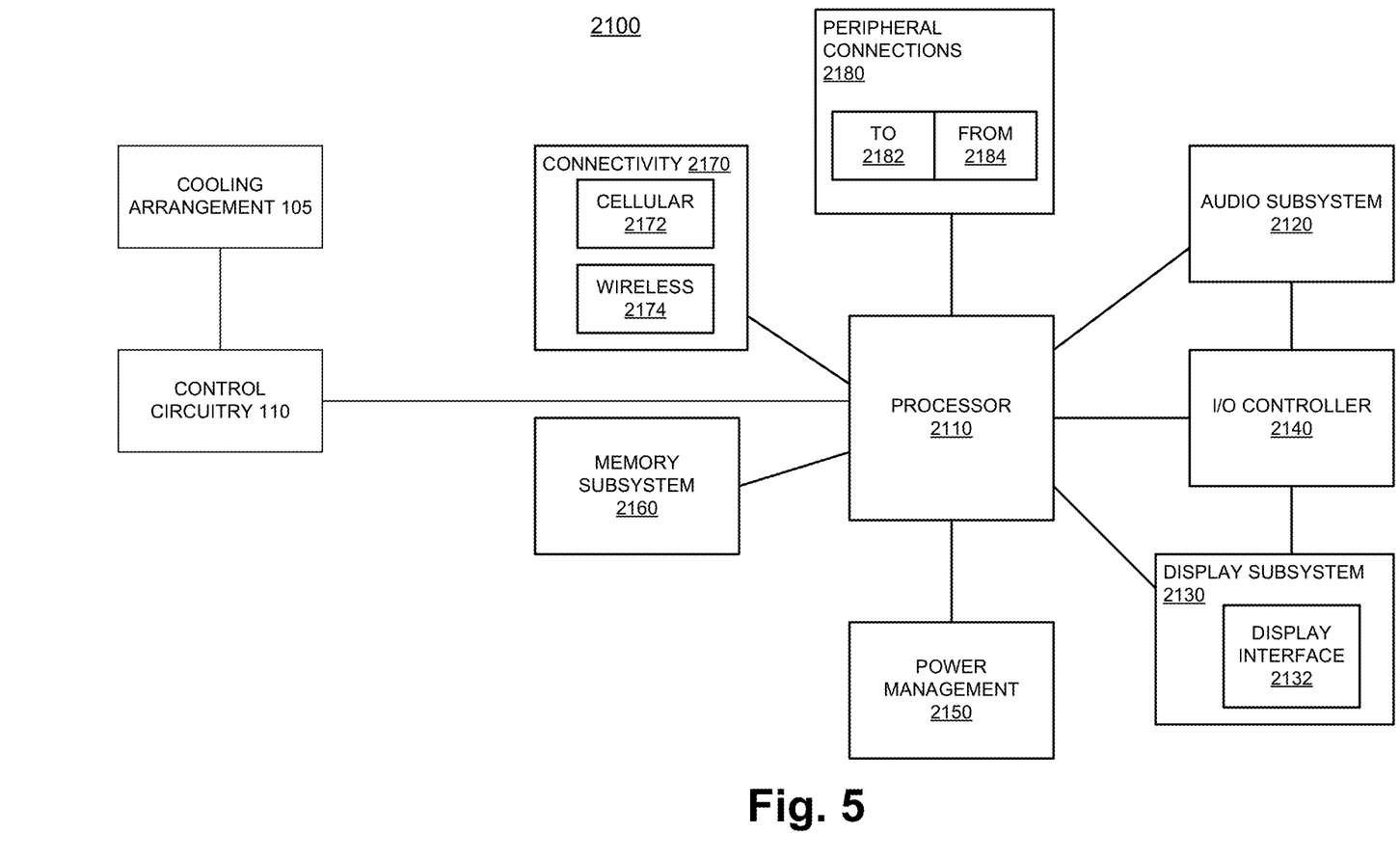
FIG. 5 illustrates a computer system, computing device or a SoC (System-on-Chip), where a control circuitry may detect potential faults in a cooling arrangement for cooling a plurality of computing devices by monitoring temperature profile of the plurality of computing devices and temperature profile of inlet coolant used for cooling, according to some embodiments.

FIG. 5 illustrates a computer system, computing device or a SoC (System-on-Chip) 2100, where a control circuitry (e.g., control circuitry 110) may detect potential faults in a cooling arrangement (e.g., cooling arrangement 105) for cooling a plurality of computing devices (e.g., computing devices 102) by monitoring temperature profile of the plurality of computing devices and temperature profile of inlet coolant used for cooling, according to some embodiments. It is pointed out that those elements of FIG. 5 having the same reference numbers (or names) as the elements of any other figure can operate or function in any manner similar to that described, but are not limited to such.

In some embodiments, computing device 2100 represents an appropriate computing device, such as a computing tablet, a server, a workstation, a mobile phone or smartphone, a laptop, a desktop, an IOT device, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant. The processor 2110 may be a SoC or a computing unit.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may comprise the control circuitry 110 of FIG. 1. In some embodiments, the control circuitry 110 may be coupled to the processor 2110, or may be separate. In some embodiments, at least a part of the control circuitry 110 may implemented using the processor 2110. The control circuitry 110 may communicate with the cooling arrangement 105. The cooling arrangement 105 may be configured to cool the computing device 2100 and/or other computing devices (e.g., computing devices 102 [not illustrated in FIG. 5]). In some embodiments, the control circuitry 110 may be configured to detect potential faults in the cooling arrangement 105, e.g., by monitoring temperature profile of various computing devices and temperature profile of coolant used for cooling, as discussed in details herein.

In some embodiments, the computing device 2100 may represent one or more of the computing devices 102 of FIG. 1. In some embodiments, cooling arrangement 105 may cool various components of the computing device 2100, e.g., cool the memory subsystem 2160, processor 2110, etc. In some embodiments, sensors (e.g., temperature sensors 122, power or energy counters, etc.) may monitor one or more parameters of the computing device 2100, e.g., as discussed in this disclosure. In some embodiments where the cooling arrangement 105 may cool the memory subsystem 2160, temperature sensors 122 may be placed at or in the vicinity of the memory subsystem 2160 (e.g., in addition to, or instead of placing the temperature sensors 122 at or in the vicinity of the processor 2110). In some embodiments where the computing device 2100 may represent one or more of the computing devices 102 of FIG. 1, some of the components illustrated in FIG. 5 may optionally be absent from the computing device 2100. For example, one or more of the audio subsystem 2120, the I/O controller 2140, the display subsystem 2130, the peripheral connections 2180 or the connectivity 2170 may be absent from the computing device 2100.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following example clauses pertain to further embodiments. Specifics in the example clauses may be used anywhere in one or more embodiments. All optional features of the apparatus described herein may also be implemented with respect to a method or process.

Clause 1. An apparatus comprising: a first circuitry to receive a measurement of a first temperature of a section of a computing device during a first loading condition of the computing device, and to receive a measurement of a second temperature of the section of the computing device during a second loading condition of the computing device; and a second circuitry to detect a potential fault in a cooling system to cool the computing device, based at least in part on the first temperature and the second temperature.

Clause 2. The apparatus of clause 1, wherein the first circuitry is further to: receive a first coolant temperature during the first loading condition of the computing device; and receive a second coolant temperature during the second loading condition of the computing device.

Clause 3. The apparatus of clause 2, wherein the first circuitry is further to: determine a first temperature difference between the first temperature and the first coolant temperature; and determine a second temperature difference between the second temperature and the second coolant temperature.

Clause 4. The apparatus of clause 3, further comprising: a third circuitry to compare the first temperature difference and the second temperature difference, wherein the second circuitry is to detect the potential fault in the cooling system, based at least in part on the comparison between the first temperature difference and the second temperature difference.

Clause 5. The apparatus of clause 4, wherein the second circuitry is to detect the potential fault in the cooling system, based at least in part on the second temperature difference being higher than the first temperature difference by at least a threshold amount.

Clause 6. The apparatus of clause 2, wherein: the first coolant temperature is a temperature of coolant in an inlet of a coolant flow path that is to cool the computing device during the first loading condition of the computing device; and the second coolant temperature is a temperature of coolant in the inlet of the coolant flow path that is to cool the computing device during the second loading condition of the computing device.

Clause 7. The apparatus of any of clauses 1-6, wherein the potential fault in the cooling system comprises a potential partial or full blockage in a coolant flow path to circulate coolant to cool the computing device.

Clause 8. The apparatus of any of clauses 1-6, wherein the first loading condition and the second loading condition are such that a power consumption of the computing device during the first loading condition is within a threshold range of a power consumption of the computing device during the second loading condition.

Clause 9. The apparatus of any of clauses 1-6, wherein the first loading condition of the computing device is achieved by loading a dedicated benchmark program on the computing device.

Clause 10. A system comprising: a computing device comprising a temperature sensor, the temperature sensor to: determine a first temperature of the computing device, and determine a second temperature of the computing device; a cooling system to cool the computing device; and a control circuitry to detect a potential blockage in a coolant flow path of the cooling system, based at least in part on the first temperature and the second temperature.

Clause 11. The system of clause 10, wherein the temperature sensor is a first temperature sensor, and wherein the system further comprises: a second temperature sensor to: determine a first coolant temperature of coolant in the coolant flow path, and determine a second coolant temperature of coolant in the coolant flow path.

Clause 12. The system of clause 11, wherein the control circuitry is to: determine a first temperature difference between the first temperature and the first coolant temperature; and determine a second temperature difference between the second temperature and the second coolant temperature.

Clause 13. The system of clause 12, wherein the control circuitry is to: compare the first temperature difference and the second temperature difference; and detect the potential blockage in the coolant flow path of the cooling system, based at least in part on the comparison between the first temperature difference and the second temperature difference.

Clause 14. The system of clause 13, wherein the control circuitry is to detect the potential blockage in the coolant flow path of the cooling system, based at least in part on the second temperature difference being higher than the first temperature difference by at least a threshold amount.

Clause 15. The system of any of clauses 10-14, wherein the control circuitry is to: generate a notification to notify about the potential blockage in the coolant flow path of the cooling system, to facilitate rectification of the potential blockage in the coolant flow path.

Clause 16. The system of any of clauses 10-14, wherein: the first temperature is measured during a first instance; the second temperature is measured during a second instance; and a computational workload of the computing device during the first instance is substantially same as a computational workload of the computing device during the second instance.

Clause 17. The system of any of clauses 10-14, further comprising: a memory coupled to the control circuitry, wherein the control circuitry is to store the first temperature and the second temperature in the memory.

Clause 18. Non-transitory computer-readable storage media to store instructions that, when executed by a processor, cause the processor to: receive a measurement of a first temperature a computing device during a first loading condition of the computing device; receive a measurement of a second temperature of the computing device during a second loading condition of the computing device; and detect a potential fault in a cooling system to cool the computing device.

Clause 19. The non-transitory computer-readable storage media of clause 18, wherein the instructions, when executed, further cause the processor to: receive a first coolant temperature during the first loading condition of the computing device; receive a second coolant temperature during the second loading condition of the computing device; compute a first temperature difference between the first temperature and the first coolant temperature; compute a second temperature difference between the second temperature and the second coolant temperature; and compare the first temperature difference and the second temperature difference, wherein the potential fault in the cooling system is detected, based at least in part on the comparison between the first temperature difference and the second temperature difference.

Clause 20. The non-transitory computer-readable storage media of any of clauses 18-19, wherein the instructions, when executed, further cause the processor to: generate a notification to notify about the potential fault in the cooling system, to facilitate rectification of the potential fault.

Clause 21. A method comprising: receiving a measurement of a first temperature a computing device during a first loading condition of the computing device; receiving a measurement of a second temperature of the computing device during a second loading condition of the computing device; and detecting a potential fault in a cooling system to cool the computing device, based at least in part on the first temperature and the second temperature.

Clause 22. The method of clause 21, wherein detecting the potential fault in the cooling system further comprises: receiving a first coolant temperature during the first loading condition of the computing device; receiving a second coolant temperature during the second loading condition of the computing device; and detecting the potential fault in the cooling system, based at least in part on the first temperature, the second temperature, the first coolant temperature, and the second coolant temperature.

Clause 23. The method of clause 22, wherein detecting the potential fault in the cooling system further comprises: computing a first temperature difference between the first temperature and the first coolant temperature; computing a second temperature difference between the second temperature and the second coolant temperature; comparing the first temperature difference and the second temperature difference; and detecting the potential fault in the cooling system, based at least in part on the comparison between the first temperature difference and the second temperature difference.

Clause 24. The method of any of clauses 21-23, further comprising: generating a notification to notify about the potential fault in the cooling system, to facilitate rectification of the potential fault.

Clause 25. The method of any of clauses 21-23, wherein: causing to operate the computing device during the first loading condition and the second loading condition such that: a power consumption of the computing device during the first loading condition is within a threshold range of a power consumption of the computing device during the second loading condition.

Clause 26. One or more non-transitory computer-readable storage media to store instructions that, when executed by a processor, cause the processor to execute a method of any of the clauses 21-25.

Clause 27. An apparatus comprising: means for performing the method of any of the clauses 21-25.

Clause 28. An apparatus comprising: means for receiving a measurement of a first temperature a computing device during a first loading condition of the computing device; means for receiving a measurement of a second temperature of the computing device during a second loading condition of the computing device; and means for detecting a potential fault in a cooling system to cool the computing device, based at least in part on the first temperature and the second temperature.

Clause 29. The apparatus of clause 28, wherein the means for detecting the potential fault in the cooling system further comprises: means for receiving a first coolant temperature during the first loading condition of the computing device; means for receiving a second coolant temperature during the second loading condition of the computing device; and means for detecting the potential fault in the cooling system, based at least in part on the first temperature, the second temperature, the first coolant temperature, and the second coolant temperature.

Clause 30. The apparatus of clause 29, wherein the means for detecting the potential fault in the cooling system further comprises: means for computing a first temperature difference between the first temperature and the first coolant temperature; means for computing a second temperature difference between the second temperature and the second coolant temperature; means for comparing the first temperature difference and the second temperature difference; and means for detecting the potential fault in the cooling system, based at least in part on the comparison between the first temperature difference and the second temperature difference.

Clause 31. The apparatus of any of clauses 28-30, further comprising: means for generating a notification to notify about the potential fault in the cooling system, to facilitate rectification of the potential fault.

Clause 32. The apparatus of any of clauses 28-30, further comprising: means for causing to operate the computing device during the first loading condition and the second loading condition such that: a power consumption of the computing device during the first loading condition is within a threshold range of a power consumption of the computing device during the second loading condition.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a first circuitry to receive a measurement of a first temperature of a section of a computing device during a first loading condition of the computing device, and to receive a measurement of a second temperature of the section of the computing device during a second loading condition of the computing device, wherein the first loading condition and the second loading condition are such that a power consumption of the computing device during the first loading condition is within a threshold range of a power consumption of the computing device during the second loading condition; and
a second circuitry to detect a potential fault in a liquid coolant flow path of a cooling system, which is configured to cool the computing device, based at least in part on the first temperature and the second temperature.

2. The apparatus of claim 1, wherein the first circuitry is further to:
receive a first coolant temperature during the first loading condition of the computing device; and
receive a second coolant temperature during the second loading condition of the computing device.

3. The apparatus of claim 2, wherein the first circuitry is further to:
   determine a first temperature difference between the first temperature and the first coolant temperature; and
   determine a second temperature difference between the second temperature and the second coolant temperature.

4. The apparatus of claim 3, further comprising:
   a third circuitry to compare the first temperature difference and the second temperature difference,
   wherein the second circuitry is to detect the potential fault in the cooling system, based at least in part on the comparison between the first temperature difference and the second temperature difference.

5. The apparatus of claim 4, wherein the second circuitry is to detect the potential fault in the cooling system, based at least in part on the second temperature difference being higher than the first temperature difference by at least a threshold amount.

6. The apparatus of claim 2, wherein:
   the first coolant temperature is a temperature of a liquid coolant in an inlet of a coolant flow path that is to cool the computing device during the first loading condition of the computing device; and
   the second coolant temperature is a temperature of a liquid coolant in the inlet of the coolant flow path that is to cool the computing device during the second loading condition of the computing device.

7. The apparatus of claim 1, wherein the potential fault in the cooling system comprises a potential partial or full blockage in the liquid coolant flow path to circulate coolant to cool the computing device.

8. The apparatus of claim 1, wherein the first loading condition of the computing device is achieved by loading a dedicated benchmark program on the computing device.

9. A system comprising:
   a computing device comprising a temperature sensor, the temperature sensor to:
      determine a first temperature of the computing device, and
      determine a second temperature of the computing device;
   a cooling system configured to cool the computing device; and
   a control circuitry to detect a potential blockage in a liquid coolant flow path of the cooling system, based at least in part on the first temperature and the second temperature, wherein:
   the first temperature is measured during a first instance;
   the second temperature is measured during a second instance; and
   a computational workload of the computing device during the first instance is substantially the same as a computational workload of the computing device during the second instance.

10. The system of claim 9, wherein the temperature sensor is a first temperature sensor, and wherein the system further comprises:
    a second temperature sensor to:
       determine a first coolant temperature of coolant in the liquid coolant flow path, and
       determine a second coolant temperature of coolant in the liquid coolant flow path.

11. The system of claim 10, wherein the control circuitry is to:
    determine a first temperature difference between the first temperature and the first coolant temperature; and
    determine a second temperature difference between the second temperature and the second coolant temperature.

12. The system of claim 11, wherein the control circuitry is to:
    compare the first temperature difference and the second temperature difference; and
    detect the potential blockage in the liquid coolant flow path of the cooling system, based at least in part on the comparison between the first temperature difference and the second temperature difference.

13. The system of claim 12, wherein the control circuitry is to detect the potential blockage in the liquid coolant flow path of the cooling system, based at least in part on the second temperature difference being higher than the first temperature difference by at least a threshold amount.

14. The system of claim 9, wherein the control circuitry is to:
    generate a notification to notify about the potential blockage in the liquid coolant flow path of the cooling system, to facilitate rectification of the potential blockage in the liquid coolant flow path.

15. The system of claim 9, further comprising:
    a memory coupled to the control circuitry,
    wherein the control circuitry is to store the first temperature and the second temperature in the memory.

16. Non-transitory computer-readable storage media to store instructions that, when executed by a processor, cause the processor to:
    receive a measurement of a first temperature of a computing device during a first loading condition of the computing device;
    receive a measurement of a second temperature of the computing device during a second loading condition of the computing device, wherein the first loading condition and the second loading condition are such that a power consumption of the computing device during the first loading condition is within a threshold range of a power consumption of the computing device during the second loading condition; and
    detect a potential fault in a liquid coolant flow path of a cooling system, which is configured to cool the computing device.

17. The non-transitory computer-readable storage media of claim 16, wherein the instructions, when executed, further cause the processor to:
    receive a first coolant temperature during the first loading condition of the computing device;
    receive a second coolant temperature during the second loading condition of the computing device;
    compute a first temperature difference between the first temperature and the first coolant temperature;
    compute a second temperature difference between the second temperature and the second coolant temperature; and
    compare the first temperature difference and the second temperature difference,
    wherein the potential fault in the cooling system is detected, based at least in part on the comparison between the first temperature difference and the second temperature difference.

18. The non-transitory computer-readable storage media of claim 16, wherein the instructions, when executed, further cause the processor to:

generate a notification to notify about the potential fault in the cooling system, to facilitate rectification of the potential fault.

\* \* \* \* \*